(12) United States Patent
Shen

(10) Patent No.: US 10,890,373 B2
(45) Date of Patent: Jan. 12, 2021

(54) PANEL COOLING DEVICE AND BUFFER TANK FOR THE SAME

(71) Applicant: Wuhan China Star Optoelectronics Technology Co., Ltd., Hubei (CN)

(72) Inventor: Teng Shen, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 206 days.

(21) Appl. No.: 15/752,569

(22) PCT Filed: Jan. 24, 2018

(86) PCT No.: PCT/CN2018/074065
§ 371 (c)(1),
(2) Date: Nov. 16, 2018

(87) PCT Pub. No.: WO2019/109489
PCT Pub. Date: Jun. 13, 2019

(65) Prior Publication Data
US 2019/0383553 A1    Dec. 19, 2019

(30) Foreign Application Priority Data
Dec. 7, 2017 (CN) .......................... 2017 1 1286328

(51) Int. Cl.
*G03F 7/26* (2006.01)
*F25D 25/00* (2006.01)
(Continued)

(52) U.S. Cl.
CPC ........... *F25D 25/00* (2013.01); *F25D 25/024* (2013.01); *G03F 7/26* (2013.01); *B08B 9/08* (2013.01)

(58) Field of Classification Search
CPC ....... F25D 25/00; F25D 25/024; F25D 25/025
See application file for complete search history.

(56) References Cited

U.S. PATENT DOCUMENTS

2009/0241590 A1* 10/2009 Eom ..................... F25D 25/025
62/449

FOREIGN PATENT DOCUMENTS

| CN | 1691209 A | 11/2005 |
|---|---|---|
| CN | 101806674 A | 8/2010 |

(Continued)

OTHER PUBLICATIONS

CN 205160948 (English Translation) (Year: 2015).*

*Primary Examiner* — Jonathan Bradford
(74) *Attorney, Agent, or Firm* — Hemisphere Law, PLLC; Zhigang Ma

(57) ABSTRACT

A buffer tank for panel cooling device is provided and includes a tank body and a carry mechanism provided in the tank body. The carry mechanism has a first slide rail, a second slide rail and a plurality of supporting frames, the first slide rail and the second slide rail are opposite to each other and fixed in the tank body, the supporting frames are arranged on the first slide rail and the second slide rail, and the supporting frames are configured to be moveable relative to the first slide rail and the second slide rail. In the disclosure, the fixed supporting frame in the buffer tank is changed to be a supporting frame intelligently driven to scroll. When cleaning and maintaining the buffer tank or handling the buffer tank fragments, the supporting frames are rolled together and are all abutted to provide enough working space to enhance operation safety.

9 Claims, 3 Drawing Sheets

(51) Int. Cl.
*F25D 25/02* (2006.01)
*B08B 9/08* (2006.01)

(56) References Cited

FOREIGN PATENT DOCUMENTS

| | | |
|---|---|---|
| CN | 102765557 A | 11/2012 |
| CN | 204184723 U | 3/2015 |
| CN | 205129395 U | 4/2016 |
| CN | 205160948 U | 4/2016 |
| CN | 105600411 A | 5/2016 |
| CN | 205366785 U | 7/2016 |
| JP | H10-95490 A | 4/1998 |

* cited by examiner

PANEL COOLING DEVICE AND BUFFER TANK FOR THE SAME

RELATED APPLICATIONS

The present application is a National Phase of International Application Number PCT/CN2018/074065, filed Jan. 24, 2018, and claims the priority of China Application No. 201711286328.4, filed Dec. 7, 2017.

FIELD OF THE DISCLOSURE

The disclosure relates to a panel manufacturing technical field, and more particularly to a panel cooling device and buffer tank for the same.

BACKGROUND

Photoresist is a necessity in display panel manufacturing. The photoresist is mainly composed of different components such as Resin, Sensitizer and Solvent. The main function of the vacuum drying process is to achieve a roughly drying through extracting the solvent in the photoresist by depressurization. After that, HP (heating device) and CP (cooling device) are used to complete the follow-up processes.

The existed cooling device usually includes a cooling tank and a buffer tank, and the buffer tank is arranged on the top of the cooling tank. Generally, the buffer tank takes up almost the entire area of the top of the cooling tank, and the top of the cooling tank cannot meet the standing space required for staff to carry out their work. However, when the buffer tank cannot be completely and effectively cleaned for a long time, a large number of particles would be accumulated inside the buffer tank, and may easily result in foreign body, such as particles, on surfaces of panels. While the height of the cooling tank is more than 5 m, the opening of the cooling tank is on the side away from the heating device and there is no room for staff to be provided in the cooling tank, so that the staffs must climb a ladder when cleaning the buffer tank. It is very difficult and there is a certain risk of climbing operations.

SUMMARY

In order to solve the problems of the existed technologies, one object of the disclosure is to provide a panel cooling device and buffer tank for the panel cooling device to provide enough working space therein for staffs.

According to one aspect of the disclosure, a buffer tank for panel cooling device is provided, which comprises a tank body and a carry mechanism provided in the tank body, wherein the carry plate comprises a first slide rail, a second slide rail and a plurality of supporting frames, the first slide rail and the second slide rail are opposite to each other and fixed in the tank body, the supporting frames are arranged on the first slide rail and the second slide rail, and the supporting frames are configured to be moveable relative to the first slide rail and the second slide rail.

In one embodiment, a number of the carrying mechanism is at least two, and the at least two carrying mechanisms are arranged to be spaced apart in a height direction of the tank body.

In one embodiment, each of the supporting frames comprises a supporting plate, a first wheel connected to a first end of the supporting plate and a second wheel connected to a second end of the supporting plate, the first wheel is arranged on the first slide rail, the second wheel is arranged on the second slide rail, and the first end and second end of the supporting plate are opposite to each other.

In one embodiment, each of the supporting frames further comprises a first connecting rod and a second connecting rod, the first connecting rod is connected between the first end of the supporting plate and the first wheel, and the second connecting rod is connected between the second end of the supporting plate and the second wheel.

In one embodiment, the first wheel and the second wheel are electromagnetically driven to roll on the first slide rail and the second slide rail, respectively.

In one embodiment, when a plurality of the supporting plates of the supporting frames are closely adjacent, a total width of the adjacent supporting plates is equal to or less than a length of the first slide rail.

In one embodiment, the first slide rail comprises a first horizontal plate and a first vertical plate, the first vertical plate is formed by bending an end of the first horizontal plate which is opposite to the second slide rail, and the first wheel is disposed on the first horizontal plate; the second slide rail comprises a second horizontal plate and a second vertical plate, the second vertical plate is formed by bending an end of the second horizontal plate which is opposite to the first slide rail, and the second wheel is disposed on the second horizontal plate.

According to another aspect of the disclosure, a panel cooling device is provided, which comprises a cooling tank and a buffer tank described above, wherein the buffer tank is disposed at top of the cooling tank.

The beneficial effect of the disclosure are as follows: In the disclosure, the fixed supporting frame in the buffer tank is changed to be a supporting frame intelligently driven to scroll. When cleaning and maintaining the buffer tank or handling the buffer tank fragments, the supporting frames are rolled together and are all abutted to provide enough working space to enhance operation safety. Besides, the buffer tank can be promptly and efficiently cleaned quickly and effect of cleaning is better, so that there are not a large number of particles in the buffer tank, quality of the panel surface and yield rate of product could be improved.

BRIEF DESCRIPTION OF THE DRAWINGS

Features and advantages in above and other aspects of the embodiments of the present disclosure could be clearer through the descriptions made below accompanying with the drawings. In the drawings.

DETAILED DESCRIPTION OF PREFERRED EMBODIMENTS

Figure 1:
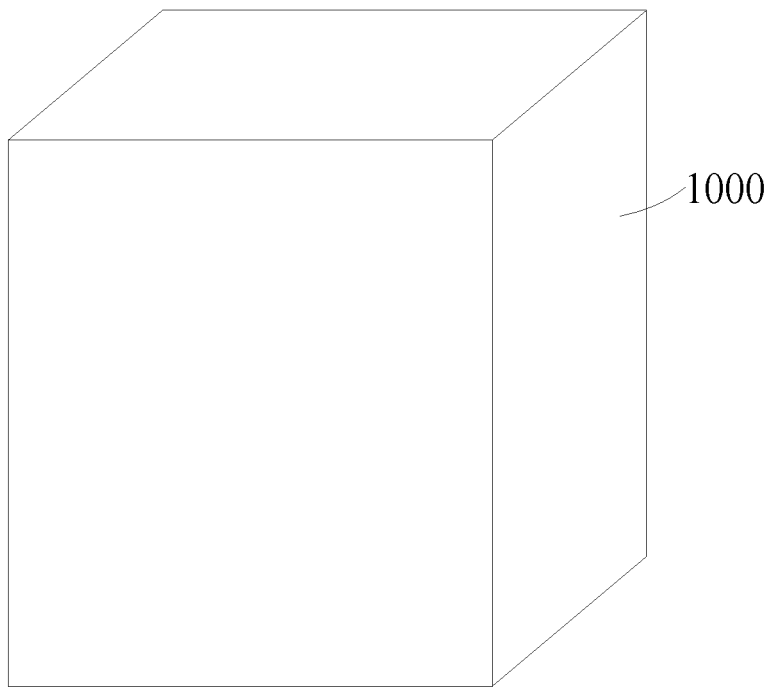
FIG. 1 is a three-dimensional diagram of the buffer tank for panel cooling device according to one embodiment of the disclosure.

The embodiments of the present disclosure are described in detail with reference to the drawings. However, the invention may be embodied in many different forms and should not be construed as limited to the specific embodiments set forth herein. Rather, these embodiments are provided to explain the principles of the disclosure and its practical application to thereby enable those of ordinary skill in the art to understand various embodiments of the disclosure and various modifications suited to particular usages.

In the drawings, the thickness of layers and regions is exaggerated for clarity. The same reference numbers indicate the same components throughout the specification and the drawings.

Figure 2:
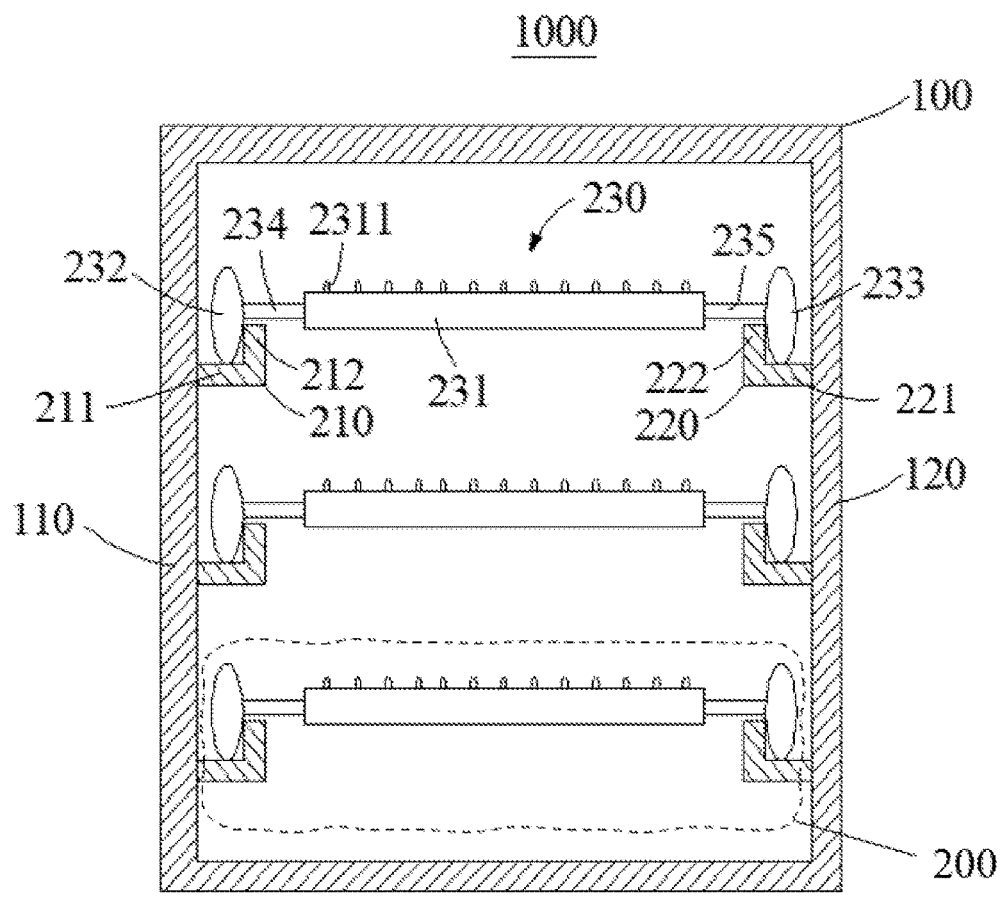
FIG. 2 is a cross-sectional diagram of the buffer tank for panel cooling device according to one embodiment of the disclosure.

FIG. 1 is a three-dimensional diagram of the buffer tank for panel cooling device according to one embodiment of the disclosure. FIG. 2 is a cross-sectional diagram of the buffer tank for panel cooling device according to one embodiment of the disclosure.

Referring to FIG. 1 and FIG. 2, the buffer tank 1000 for panel cooling device according to one embodiment of the disclosure comprises a tank body 100 and a carry mechanism 200 provided in the tank body 100. The carry mechanism is configured to carry display panels, glass substrates, or etc.

In the embodiment, the number of the carry mechanism 200 is three, but the invention is not limited thereto. For example, the number of the carry mechanism could be 1, 2, 4 or more. The three carry mechanisms 200 are arranged to be spaced apart in a height direction of the tank body 100 (i.e., the direction from up to down or from down to up in FIG. 2). In one embodiment, the three carry mechanisms 200 are arranged to be evenly spaced apart in the height direction of the tank body 100.

Each carry mechanism 200 comprises a first slide rail 210, a second slide rail 220 and a plurality of supporting frames 230. The first slide rail 210 and the second slide rail 220 are opposite to each other and fixed in the tank body 100, for example, the first slide rail 210 and the second slide rail 220 are fixed on the opposite two inner sidewalls 110 and 120 of the tank body 100, respectively. The supporting frames 230 are arranged on the first slide rail 210 and the second slide rail 220, and the supporting frames 230 are configured to be moveable relative to the first slide rail 210 and the second slide rail 220. Generally, the display panel or glass substrate are carried on the supporting frames 230.

In one preferred embodiment, each of the supporting frames 230 comprises a supporting plate 231, a first wheel 232 connected to a first end of the supporting plate 231 and a second wheel 233 connected to a second end of the supporting plate 231, the first wheel 232 is arranged on the first slide rail 210, the second wheel 233 is arranged on the second slide rail 220, and the first end and second end of the supporting plate 231 are opposite to each other. In addition, a plurality of supporting pins 2311 are provided on the supporting plate 231 to support the display panels or glass substrates when they are carried by the supporting plate 231.

Furthermore, the supporting frame 230 further comprises a first connecting rod 234 and a second connecting rod 235. The first connecting rod 234 is connected between the first end of the supporting plate 231 and the first wheel 232 to realize the connection between the first end of the supporting plate 231 and the first wheel 232; and the second connecting rod 235 is connected between the second end of the supporting plate 231 and the second wheel 233 to realize the connection between the second end of the supporting plate 231 and the second wheel 233. In another embodiment, the first connecting rod 234 and the second connecting rod 235 may not be included in the supporting plate 231, and the first end and the second end of the supporting plate are directly connected to the first wheel 232 and the second wheel 233, respectively.

In the embodiment, the first wheel 232 and the second wheel 233 are electromagnetically driven to roll on the first slide rail 210 and the second slide rail 220, respectively. For example, the first wheel 232 and the second wheel 233 can be controlled through an external controller to roll on the first slide rail 210 and the second slide rail 220, respectively.

In addition, the first slide rail 210 comprises a first horizontal plate 211 and a first vertical plate 212, the first vertical plate 212 is formed by bending an end of the first horizontal plate 211 which is opposite to the second slide rail 220. The first wheel 232 is disposed on the first horizontal plate 211 and the first vertical plate 212 limits the first wheel 232 from being off the first horizontal plate 211. Similarly, the second slide rail 220 comprises a second horizontal plate 221 and a second vertical plate 222, the second vertical plate 222 is formed by bending an end of the second horizontal plate 221 which is opposite to the first slide rail 210. The second wheel 233 is disposed on the second horizontal plate 221 and the second vertical plate 222 limits the second wheel 233 from being off the second horizontal plate 221.

Figure 3:
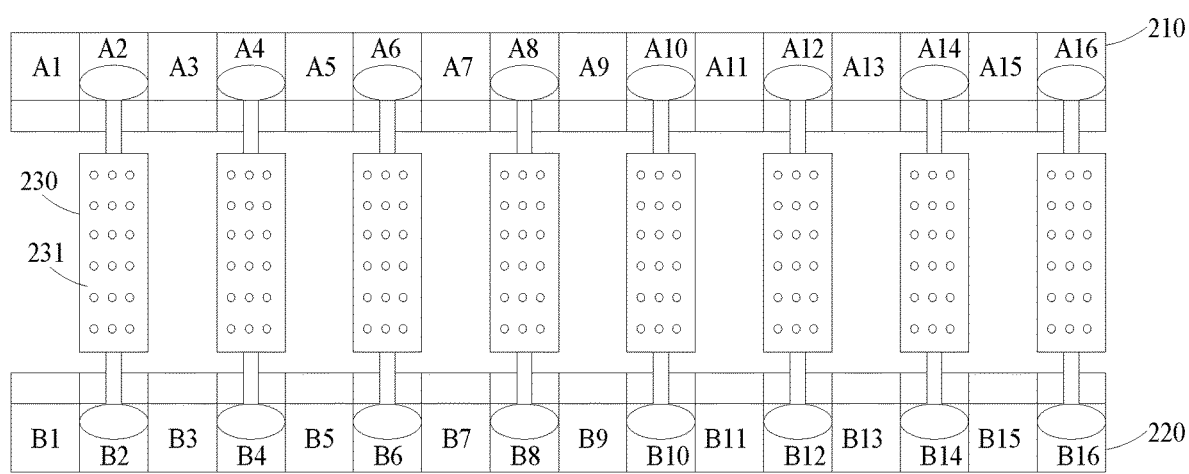
FIG. 3 is a top view of the carry mechanism while carrying panels according to one embodiment of the disclosure.
Figure 4:
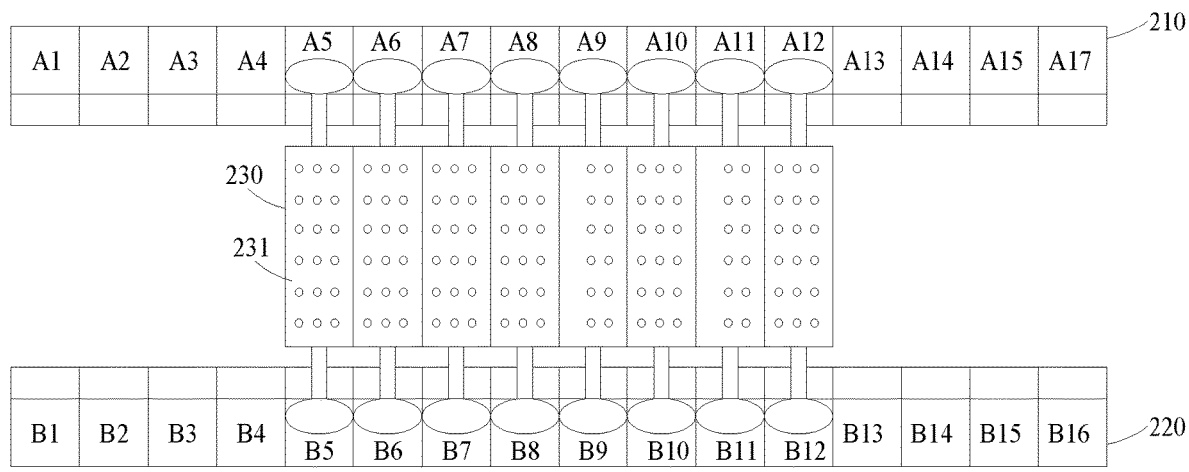
FIG. 4 is a top view of the carry mechanism while cleaning the buffer tank according to one embodiment of the disclosure.

FIG. 3 is a top view of the carry mechanism while carrying panels according to one embodiment of the disclosure. FIG. 4 is a top view of the carry mechanism while cleaning the buffer tank according to one embodiment of the disclosure.

Referring to FIG. 3, when the carry mechanism 200 is carrying the display panels or glass substrates, a plurality of supporting frames 230 are arranged between the first slide rail 210 and the second slide rail 220 and are evenly spaced apart. There are eight supporting mechanisms 230 shown in this figure, and the first slide rail 210 and the second slide rail 220 are divided into 16 areas, i.e., the first slide rail 210 is divided into areas A1~A16, the second slide rail 220 is divided into areas B1~B16, and the areas A1~A16 are corresponding to the areas B1~B16 one-by-one. The width of each of the areas A1~A16 is the same as the width of each of the areas B1~B16 and is the same as the width of the supporting plate 231 of each supporting frame 230. Of course, the width of each of the areas A1~A16 and the width of each of the areas B1~B16 could be greater than the width of the supporting plate 231 of each supporting frame 230.

Referring to FIG. 4, when cleaning or other operation is performed for the buffer tank 1000, the eight carry mechanisms 230 are controlled to slide on the first slide rail 210 and the slide rail 220 so that the eight carry mechanisms 230 are closely adjacent one-by-one. The width of the eight supporting plates 231 of the closely adjacent eight carry mechanisms 230 is the same as the width of eight of the areas A1~A16 and is the same as the width of eight of the areas B1~B16, so that the width of another eight of the areas A1~A16 and another eight of the areas B1~B16 is available as working space for stuffs. When the width of each of the areas A1~A16 and the width of each of the areas B1~B16 are larger than the width of the supporting plate 231 of each supporting frame 230, the width of the closely adjacent eight carry mechanisms 230 is smaller than the width of eight of the areas A1~A16 and is smaller than the width of eight of the areas B1~B16 so that the working space for stuffs would be larger.

Figure 5:
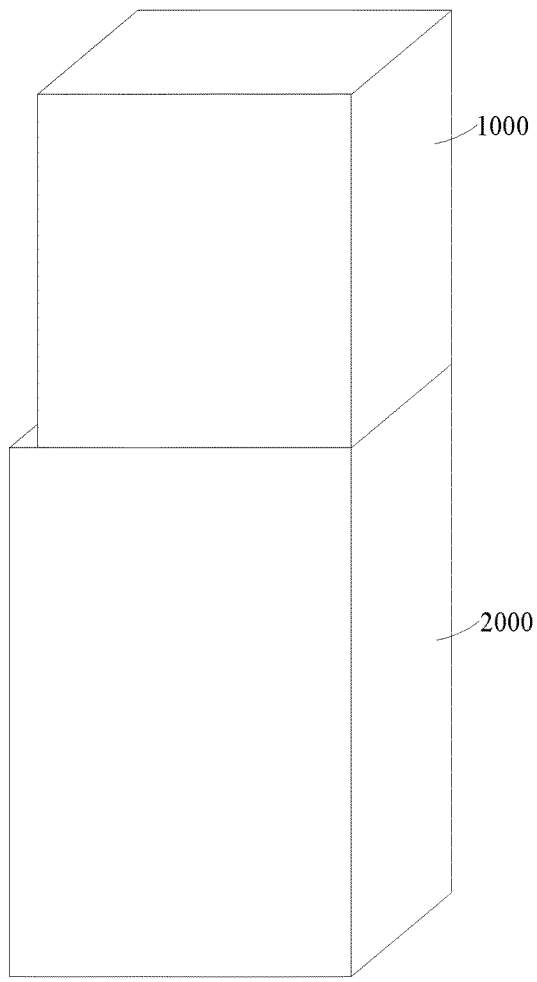
FIG. 5 is a structural schematic diagram of the panel cooling device according to one embodiment of the disclosure.

FIG. 5 is a structural schematic diagram of the panel cooling device according to one embodiment of the disclosure.

Referring to FIG. 5, the panel cooling device according to the embodiment of the disclosure comprises the cooling tank 2000 and the buffer tank 1000 as described above, and the buffer tank 1000 is disposed at top of the cooling tank 2000.

In summary, according to the embodiments of the disclosure, the fixed supporting frame in the buffer tank is changed to be a supporting frame intelligently driven to scroll. When cleaning and maintaining the buffer tank or handling the buffer tank fragments, the supporting frames are rolled together and are all abutted to provide enough working space to enhance operation safety. Besides, the buffer tank can be promptly and efficiently cleaned quickly and effect of cleaning is better, so that there are not a large number of particles in the buffer tank, quality of the panel surface and yield rate of product could be improved.

The foregoing contents are detailed description of the disclosure in conjunction with specific preferred embodiments and concrete embodiments of the disclosure are not limited to the description. For the person skilled in the art of the disclosure, without departing from the concept of the disclosure, simple deductions or substitutions can be made and should be included in the protection scope of the application.

What is claimed is:

1. A buffer tank of a panel cooling device, comprising a tank body and a carry mechanism provided in the tank body, wherein the carry mechanism comprises a first slide rail, a second slide rail and a plurality of supporting frames, the first slide rail and the second slide rail are opposite to each other and fixed in the tank body, the supporting frames are arranged on the first slide rail and the second slide rail, and the supporting frames are configured to be moveable relative to the first slide rail and the second slide rail;

wherein each of the supporting frames comprises a supporting plate, a first wheel connected to a first end of the supporting plate and a second wheel connected to a second end of the supporting plate, the first wheel is arranged on the first slide rail, the second wheel is arranged on the second slide rail, and the first end and second end of the supporting plate are opposite to each other; and wherein when a plurality of the supporting plates of the supporting frames are adjacent, a total width of the adjacent supporting plates is equal to or less than a length of the first slide rail.

2. The buffer tank according to claim 1, wherein a number of the carrying mechanism is at least two, and the at least two carrying mechanisms are arranged to be spaced apart in a height direction of the tank body.

3. The buffer tank according to claim 1, wherein each of the supporting frames further comprises a first connecting rod and a second connecting rod, the first connecting rod is connected between the first end of the supporting plate and the first wheel, and the second connecting rod is connected between the second end of the supporting plate and the second wheel.

4. The buffer tank according to claim 2, wherein each of the supporting frames further comprises a first connecting rod and a second connecting rod, the first connecting rod is connected between the first end of the supporting plate and the first wheel, and the second connecting rod is connected between the second end of the supporting plate and the second wheel.

5. The buffer tank according to claim 1, wherein the first wheel and the second wheel are electromagnetically driven to roll on the first slide rail and the second slide rail, respectively.

6. The buffer tank according to claim 2, wherein the first wheel and the second wheel are electromagnetically driven to roll on the first slide rail and the second slide rail, respectively.

7. The buffer tank according to claim 1, wherein the first slide rail comprises a first horizontal plate and a first vertical plate, the first vertical plate is formed by bending an end of the first horizontal plate which is opposite to the second slide rail, and the first wheel is disposed on the first horizontal plate;

the second slide rail comprises a second horizontal plate and a second vertical plate, the second vertical plate is formed by bending an end of the second horizontal plate which is opposite to the first slide rail, and the second wheel is disposed on the second horizontal plate.

8. The buffer tank according to claim 2, wherein the first slide rail comprises a first horizontal plate, and a first vertical plate, the first vertical plate is formed by bending an end of the first horizontal plate which is opposite to the second slide rail, and the first wheel is disposed on the first horizontal plate;

the second slide rail comprises a second horizontal plate and a second vertical plate, the second vertical plate is formed by bending an end of the second horizontal plate which is opposite to the first slide rail, and the second wheel is disposed on the second horizontal plate.

9. A panel cooling device comprising a cooling tank and a buffer tank according to claim 1, wherein the buffer tank is disposed at top of the cooling tank.

* * * * *